United States Patent
Xia et al.

(10) Patent No.: US 9,704,900 B1
(45) Date of Patent: Jul. 11, 2017

(54) SYSTEMS AND METHODS FOR FORMING MICROCHANNEL PLATE (MCP) PHOTODETECTOR ASSEMBLIES

(71) Applicant: UCHICAGO ARGONNE, LLC, Chicago, IL (US)

(72) Inventors: Lei Xia, Chicago, IL (US); Huyue Zhao, Downers Grove, IL (US); Robert G. Wagner, Bolingbrook, IL (US); Joseph S. Gregar, Bolingbrook, IL (US); Junqi Xie, Naperville, IL (US); Jingbo Wang, Willowbrook, IL (US)

(73) Assignee: UCHICAGO ARGONNE, LLC, Chicago, IL (US)

( * ) Notice: Subject to any disclaimer, the term of this patent is extended or adjusted under 35 U.S.C. 154(b) by 0 days.

(21) Appl. No.: 15/098,194

(22) Filed: Apr. 13, 2016

(51) Int. Cl.
*H01L 31/0203* (2014.01)
*H01L 27/146* (2006.01)

(52) U.S. Cl.
CPC .. *H01L 27/14618* (2013.01); *H01L 27/14636* (2013.01); *H01L 27/14683* (2013.01)

(58) Field of Classification Search
CPC ......... H01L 27/14618; H01L 27/14636; H01L 27/14683
USPC ....................................................... 257/433
See application file for complete search history.

(56) References Cited

U.S. PATENT DOCUMENTS

| | | | | |
|---|---|---|---|---|
| 5,086,248 A * | 2/1992 | Horton | ...................... | H01J 9/12 313/103 CM |
| 5,495,141 A * | 2/1996 | Thomas | ................ | H01J 31/507 313/524 |
| 6,311,001 B1 * | 10/2001 | Rosine | .................. | C03B 37/028 385/120 |
| 2004/0101261 A1 * | 5/2004 | Rosine | ..................... | G02B 6/08 385/120 |
| 2004/0245592 A1 * | 12/2004 | Harmon | ................ | G01J 1/4228 257/438 |
| 2010/0044577 A1 * | 2/2010 | Sullivan | .................... | G01T 3/08 250/390.01 |
| 2012/0161010 A1 * | 6/2012 | Azzazy | ................... | H01J 31/48 250/353 |
| 2013/0193831 A1 * | 8/2013 | Sullivan | ................. | H01J 43/04 313/103 CM |

OTHER PUBLICATIONS

Varner, Gary S., Updates on the Large Area Picosecond Photo-Detector (LAPPD) Project and Integrated Readout Electronics, AAP meeting in Hawaii, Oct. 5, 2012, 60 pages.

* cited by examiner

*Primary Examiner* — Vongsavanh Sengdara
(74) *Attorney, Agent, or Firm* — Foley & Lardner LLP

(57) ABSTRACT

A MCP photodetector assembly includes an anode plate including a plurality of electrical traces positioned thereon, a plurality of MCPs and a plurality of grid spacers. The MCPs are positioned between the grid spacers. The grid spacers have a grid spacer shape defining at least one aperture. A plurality of shims are positioned between the grid spacers and the MCPs so as to form a stack positioned on the anode plate. Each of the plurality of shims have a shim shape which is the same as the grid spacer shape such that each of the plurality of shims and each of the plurality of grid spacers overlap so as to define at least one MCP aperture. At least a portion of the plurality of MCPs are positioned within the MCP aperture. The shims are structured to electrically couple the MCPs to the anode plate.

17 Claims, 4 Drawing Sheets

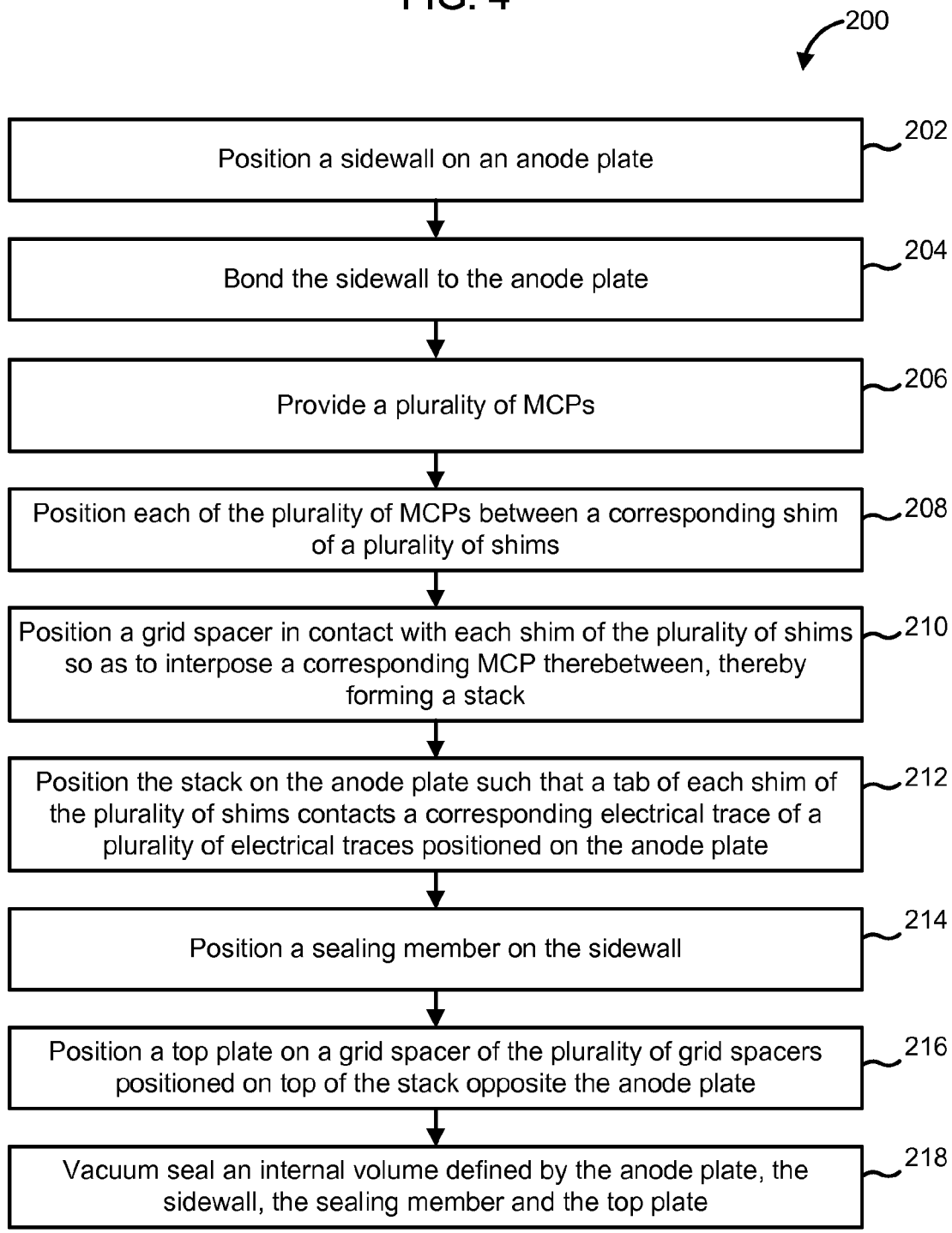

SYSTEMS AND METHODS FOR FORMING MICROCHANNEL PLATE (MCP) PHOTODETECTOR ASSEMBLIES

The United States Government claims certain rights in this invention pursuant to Contract No. W-31-109-ENG-38 between the United States Government and the University of Chicago and/or pursuant to DE-AC02-06CH11357 between the United States Government and UChicago Argonne, LLC representing Argonne National Laboratory.

TECHNICAL FIELD

The present disclosure relates generally to systems and methods of forming photodetectors.

BACKGROUND

Microchannel plate (MCP) photodetectors are a class of sensors configured to sense light or any other electromagnetic signal. MCP photodetectors generally include a plurality MCPs (e.g., two MCPs) arranged in a stack to amplify photoelectrons produced on a photocathode by the photons impinging on the photocathode (e.g., a cathode plate) and/or on the MCPs. Each MCP included in the MCP photodetector generally includes a planar substrate (e.g. a conducting or semi-conducting substrate such as a silicon substrate, an oxide substrate, a ceramic substrate, a glass substrate etc.) having an array of microchannels defined through the substrate. The microchannels can have a diameter and maybe inclined with respect to the planar substrate.

The MCP photodetectors may include a detector (e.g., an anode plate) so as to determine the current generated by the photoelectrons and subsequently amplified by MCPs which is indicative of the amount of photons impinging on the photocathode and/or a top MCP surface exposed to the photons. For the MCP photodetectors to function properly, the electrically conductive surfaces of the plurality of MCPs (i.e., the top and bottom surface of each MCP) and the cathode and the anode plate are biased or polarized at an appropriate electric potential. However, MCP photodetector assemblies are generally hermetically sealed under ultrahigh vacuum (UHV) which limits the type of material and connections that may be used for providing electrical connections in the MCP photodetector assembly from external electronics.

SUMMARY

Embodiments described herein relate generally to systems and methods for forming MCP photodetectors and in particular, to MCP photodetector assemblies that include a stack including a plurality of MCPs separated by a plurality of grid spacers and a plurality of shims contacting a surface of each of the plurality of MCPs. The shims are structured to electrically couple the MCPs to an anode plate on which the stack is positioned.

In some embodiments, a MCP photodetector assembly comprises an anode plate including a plurality of electrical traces positioned thereon, and a plurality of MCPs. The MCP photodetector assembly also includes a plurality of grid spacers. The plurality of MCPs are positioned between the plurality of grid spacers. Each of the plurality of grid spacers has a grid spacer shape defining at least one aperture. A plurality of shims are positioned between each of the plurality of grid spacers and the plurality of MCPs so as to form a stack. The stack is positioned on the anode plate. Each of the plurality of shims has a shim shape. The shim shape and the grid spacer shape are the same such that each of the plurality of shims and each of the plurality of grid spacers overlap so as to define at least one MCP aperture. At least a portion of the plurality of MCPs are positioned within the MCP aperture. Each of the plurality of shims include an electrically conductive material so as to conduct an electric signal to a corresponding surface of a corresponding MCP in contact with a respective shim. Each shim further includes a tab positioned proximate to the anode plate. The tab extends beneath the stack so as to contact a corresponding electrical trace of the plurality of electrical traces, thereby electrically coupling the corresponding surface of the corresponding MCP to the corresponding electrical trace.

In some embodiments, a MCP photodetector packaging assembly for stacking and electrically coupling a plurality of MCPs comprises an anode plate including a plurality of electrical traces positioned thereon. The MCP photodetector packaging assembly also includes a plurality of grid spacers. Each of the plurality of MCPs are positionable between a pair of the plurality of grid spacers so as to be interposed therebetween. A plurality of shims are positionable between each of the plurality of grid spacers and the plurality of MCPs so as to form a stack. The stack is positionable on the anode plate. Each of the plurality of shims includes an electrically conductive material so as to conduct an electric signal to a corresponding surface of a corresponding MCP in contact with a respective shim of the plurality of shims. Each shim further includes a leg extending orthogonally away from a side of the shim towards the anode plate. A tab is positioned on an end of the leg located proximate to the anode plate. The tab extends orthogonally from the leg so as to be positionable beneath the stack. The tab is structured to contact a corresponding electrical trace of the plurality of electrical traces so as to electrically couple the corresponding surface of the corresponding MCP to the corresponding electrical trace.

In some embodiments, a method of forming a MCP photodetector assembly comprises providing a plurality of MCPs. Each MCP of the plurality of MCPs is positioned between a corresponding shim of a plurality of shims. Each shim includes a shim frame in contact with a corresponding surface of the MCP. A leg extends orthogonally away from a side of the shim frame. A tab is positioned on an end of the leg distal from the shim frame. The tab extends orthogonally away from the leg towards shim frame. A grid spacer is positioned in contact with each shim of the plurality of shims so as to interpose a corresponding MCP therebetween, thereby forming a stack. The stack is positioned on an anode plate which includes a plurality of electrical traces positioned thereon such that a tab of each shim of the plurality of shims contacts a corresponding electrical trace of the plurality of electrical traces positioned on the anode plate so as to form an electrical coupling therebetween.

It should be appreciated that all combinations of the foregoing concepts and additional concepts discussed in greater detail below (provided such concepts are not mutually inconsistent) are contemplated as being part of the subject matter disclosed herein. In particular, all combinations of claimed subject matter appearing at the end of this disclosure are contemplated as being part of the subject matter disclosed herein.

BRIEF DESCRIPTION OF DRAWINGS

The foregoing and other features of the present disclosure will become more fully apparent from the following description and appended claims, taken in conjunction with the accompanying drawings. Understanding that these drawings depict only several implementations in accordance with the disclosure and are therefore, not to be considered limiting of its scope, the disclosure will be described with additional specificity and detail through use of the accompanying drawings.

FIG. 4 is a schematic flow diagram of an example method for forming an MCP photodetector assembly according to an embodiment.

Figure 1:
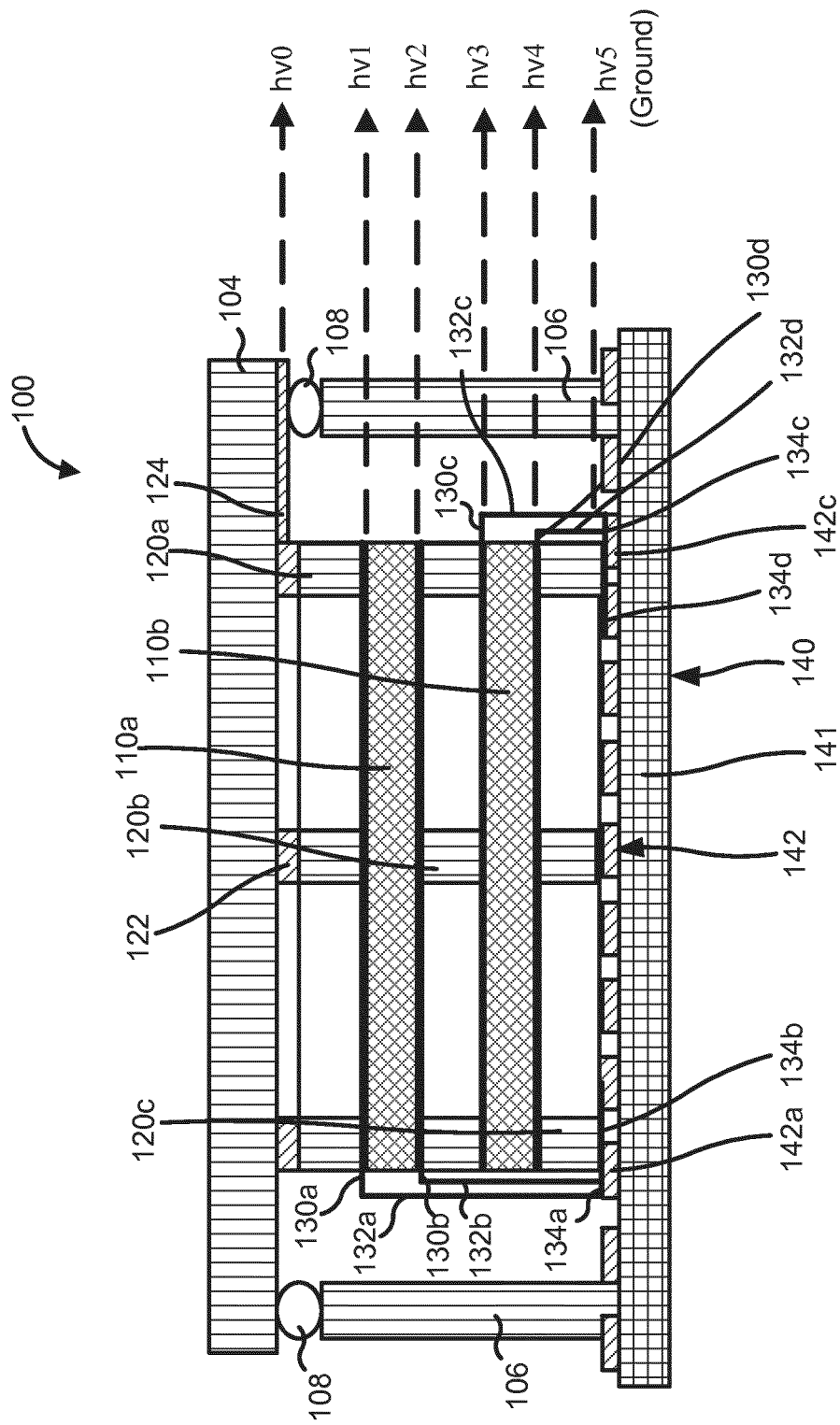
FIG. 1 is a side cross-section view of a MCP photodetector assembly according to an embodiment.

Reference is made to the accompanying drawings throughout the following detailed description. In the drawings, similar symbols typically identify similar components, unless context dictates otherwise. The illustrative implementations described in the detailed description, drawings, and claims are not meant to be limiting. Other implementations may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

DETAILED DESCRIPTION OF VARIOUS EMBODIMENTS

Embodiments described herein relate generally to systems and methods for forming MCP photodetectors and in particular, to MCP photodetector assemblies that include a stack including a plurality of MCPs separated by a plurality of grid spacers and a plurality of shim contacting a surface of each of the plurality of MCPs. The shims are structured to electrically couple the MCPs to an anode plate on which the stack is positioned.

MCP photodetectors are a class of sensors configured to sense light or any other electromagnetic signal. MCP photodetectors generally include a plurality MCPs (e.g., two MCPs) arranged in a stack to amplify photoelectrons produced on a photocathode by the photons impinging on the photocathode (e.g., a cathode plate) and/or atop MCP surface exposed to the photons. Each MCP included in the MCP photodetector assembly generally includes a planar high resistance substrate (e.g. a conducting or semi-conducting substrate such as a glass substrate, a silicon substrate, an oxide substrate, a ceramic substrate, etc.) having an array of microchannels defined therethrough. Furthermore, each of the microchannels may be inclined at an angle with respect to the planar substrate.

Each MCP included in the MCP photodetector may serve as a continuous-dynode electron multiplier. The multiplication takes place under the influence of a strong electric field. As described before, each microchannel defined through the MCP is generally inclined at an angle with respect to the planar substrate. The inclination causes an electron entering any one of the plurality of channels to hit the walls of the microchannel.

The impact of the electron within the microchannel wall may start an electron cascade which propagates through the microchannel, thereby amplifying the photon signal several orders of magnitude depending upon the strength of the electric field and the microchannel geometry. The electric field may be applied on each surface of the planar substrate forming the MCP. The electrons may exit the microchannels on the opposite side where they may impact an anode plate. The anode plate communicates the total current from the cascade of electrons from each microchannel to an external detector for detection and measurement. The electron signal from each microchannel may be monitored independently and combined to produce an image.

MCP photodetector assemblies are generally hermetically sealed under UHV. This limits the type of material and connections that may be used for providing electrical connections to the components of the MCP photodetector assembly from the external detectors or high voltage sources. Particularly, there are two main concerns, namely: (1) reliably delivering electrical connections from external electrical equipment exposed to ambient atmosphere to components of the MCP photodetector assembly positioned inside the MCP photodetector package (e.g., the MCPs) that is under ultrahigh vacuum; and (2) establishing electrical contact between the planar surfaces of the MCPs and the external electrical connections leading into the MCP photodetector assembly. Cathode plates and/or anode plates included in the MCP photodetector assembly generally include electrical connections or leads that extend outside of the MCP photodetector assembly packaging and, therefore connecting these to external electronic devices may be relatively trivial.

Generally MCP photodetector assemblies use a ceramic detector packaging including ceramic rings interleaved with metal rings, which are brazed together to form the MCP photodetector body separating the internal volume at UHV from outside air. The metal rings contact the surface and are also accessible from outside the package, and serve as the electrical leads for the MCP photodetector assembly. However, such ceramic packages are expensive and cannot be scaled to larger detector sizes.

In contrast, embodiments of the systems and methods for forming MCP photodetector assemblies described herein may provide benefits, for example: (1) providing an all glass packaging which is significantly cheaper than ceramic packaging generally used in MCP photodetector assemblies; (2) providing transparent, semi-transparent or opaque grid spacers to separate a plurality of MCPs included in the photodetector assembly which provide support over a larger surface area of the MCP without obstructing photoelectrons or electrons from reaching the MCP, thereby allowing substantial increase in overall size of the MCP photodetector assembly; (3) providing shims between the grid spacers and the surfaces of each MCP so as to electrically couple the surface of the MCPs to electrical traces on an anode plate of the MCP photodetector assembly; and (4) providing electrical coupling of the shim to the electrically conductive surfaces of the MCPs as well as the electrical traces on the anode plate using mechanical pressure exerted by the MCP photodetector packaging on a cathode plate and anode plate due to the UHV, thereby obviating the use of complex electrical coupling strategies.

FIG. 1 is a side cross-section view of an MCP photodetector assembly 100, according to an embodiment. The MCP photodetector assembly 100 includes a first MCP 110a and a second MCP 110b (collectively referred to herein as the "MCPs 110"), a first grid spacer 120a, a second grid spacer 120b and a third grid spacer 120c (collectively referred to herein as the "grid spacers 120"), a first shim 130a, a second shim 130b, a third shim 130c and a fourth shim 130d (collectively referred to herein as the "shims 130"), a photocathode 122 and an anode plate 140.

The anode plate 140 includes an anode plate substrate 141 including a plurality of electrical traces 142 positioned thereon. The anode plate substrate 141 can be formed from any suitable insulating material, for example glass, silicon oxide, silicon nitride, Pyrex, quartz, sapphire, etc., plastics, etc. In some embodiments, the anode plate substrate 141 is formed from a transparent material such as glass. The electrical traces 142 can include very thin traces of conducting material such as silver, copper, gold, platinum, etc. In particular embodiments, the electrical traces 142 may include silver paste silk screen printed on the anode plate substrate 141. At least a portion of the anode plate 140 extends beneath and out of a perimeter defined by a sidewall 106 positioned on the anode plate 140, as described herein such that one or more of the electrical traces 142 may be coupled to external electrical equipment (e.g., a high voltage source or a detector). At least a portion of the electrical traces 142 may be coupled to an electrical ground (hv5). Furthermore, a set of the electrical traces 142 are configured to be electrically coupled to surfaces of the corresponding MCPs 110, as described herein. In various embodiments, the set of electrical traces 142 may have length less than half of a total length of the anode plate and configured to communicate a high voltage therethrough, for example in a range of 0 Volts to 5,000 Volts inclusive of all ranges and values therebetween.

The plurality of MCPs 110 include a planar substrate which includes a plurality of microchannels (not shown) defined therethrough. The substrate can be formed from a highly resistive material, for example glass, silicon, silicon oxide, germanium, silicon carbide, or any other suitable planar substrate. In some embodiments, the substrate includes a transparent material, for example glass, silicon oxide, Pyrex, quartz, sapphire, etc. The substrate may have a thickness in the range of about 500 microns to 10 millimeters inclusive of all ranges and values therebetween. The plurality of microchannels are located in an array in the substrate of the plurality of MCPs 110, for example in a rectangular, square, hexagonal, honeycomb or any other suitable array or pattern.

In some embodiments, a diameter of each of the microchannels can be in the range of 5 microns to 40 microns (e.g., 5, 6, 7, 8, 9, 10, 12, 14, 16, 18, 20, 24, 28, 32, 38 or 40 microns inclusive of all ranges and values therebetween). In some embodiments, a distance between adjacent microchannels can be in the range of 15 microns to 800 microns (e.g., 15, 20, 25, 30, 35, 40, 45, 50, 55, 60, 65, 70, 75 or 80 microns inclusive of all ranges and values therebetween). Moreover, the microchannels may be inclined at an angle of 5 degrees to 15 degrees relative to a vertical axis of the MCP photodetector assembly 100 (e.g., at an angle of 5, 6, 7, 8, 9, 10, 11, 12, 13, 14 or 15 degrees inclusive of all ranges and values therebetween). As shown in FIG. 1, the MCP photodetector assembly 100 includes the first MCP 110a the second MCP 110b. In some embodiments, the MCP photodetector assembly 100 can include any number of MCPs (e.g., 2, 3, 4 or even more).

The plurality of MCPs 110 are positioned between the plurality of grid spacers 120. Each of the plurality of grid spacers 120 defines a grid spacer shape structured to provide structural support to the corresponding MCP 110 positioned therebetween over a larger surface area of the MCP 110 so as to allow fabrication of large area MCP photodetector assemblies, as described in detail herein.

Figure 2A:
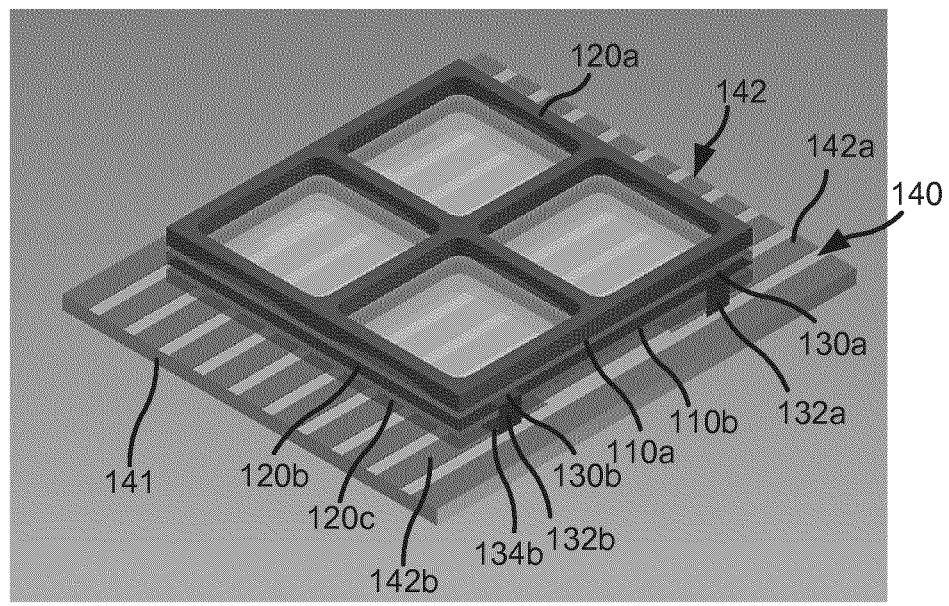
FIG. 2A is a perspective view and FIG. 2B is a top view of a portion of the MCP photodetector assembly of FIG. 1.
Figure 2B:
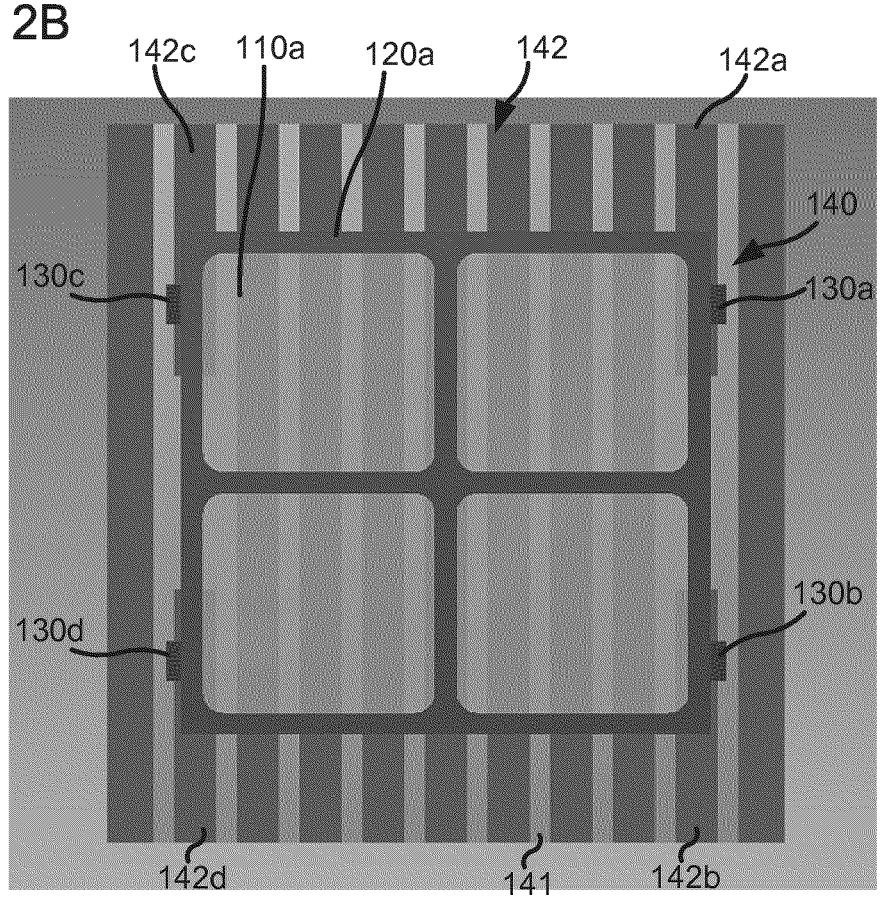

As shown in FIG. 1 and FIGS. 2A-B, the first MCP 110a is positioned between the first grid spacer 120a and the second grid spacer 120b. The second MCP 110b is positioned between the second grid spacer 120b and the third grid spacer 120c. While FIG. 1 shows the MCP photodetector assembly 100 including three grid spacers 120, in some embodiments, the MCP photodetector assembly 100 can include any number of grid spacers 120 corresponding to the number of MCPs 110 included in the MCP photodetector assembly 100. Each of the plurality of grid spacers 120 may be formed from a transparent material, for example glass, silicon oxide, quartz, Pyrex, sapphire, etc. In other embodiments, the plurality of grid spacers 120 may be formed from a semi-transparent or opaque material such that the photoelectrons produced by the photocathode 122 may pass through the one or more apertures defined in each of the plurality of grid spacers 120, as described herein.

Figure 3A:
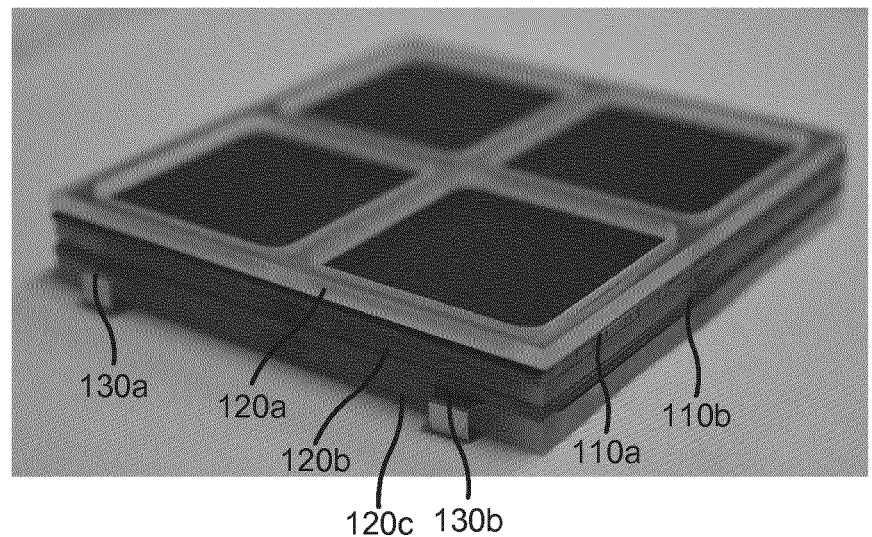
FIG. 3A is a perspective view of a stack of grid spacers, MCP photodetectors and shims included in the MCP photodetector assembly of FIG. 1.
Figure 3B:
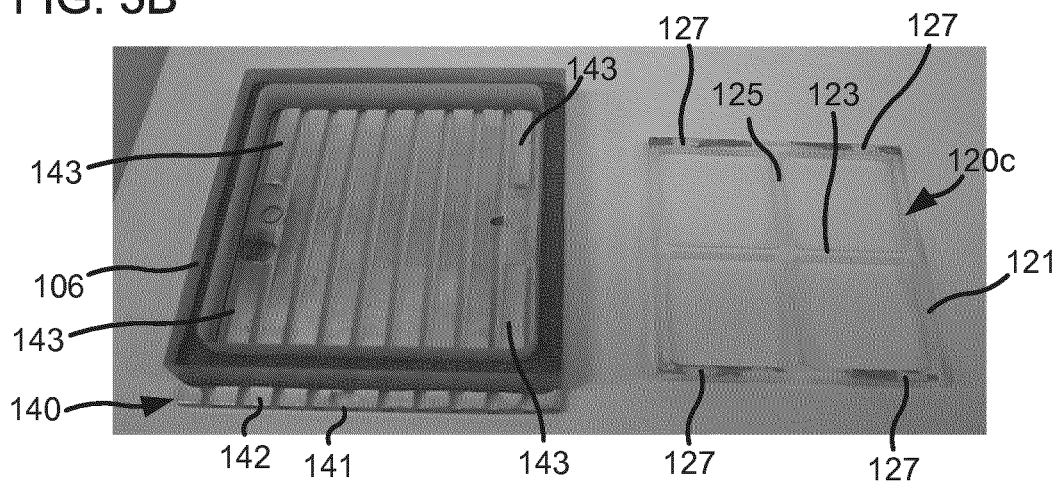
FIG. 3B is a front, top perspective view of a lower detector package that includes a glass side wall and an anode plate which bonded together by glass frit (left) and a bottom or third grid spacer (right) of the MCP photodetector assembly of FIG. 1 that has notches cut on a bottom surface thereof to accommodate tabs of a plurality of shims included in the photodetector assembly of FIG. 1.

FIG. 3B (right) shows a top, front, perspective view of the third grid spacer 120c of the plurality of grid spacers 120. The third grid spacer 120c is structured to be positioned on the anode plate 140. The first grid spacer 120a and the second grid spacer 120b are substantially the same as the third grid spacer 120c. However, the third grid spacer 120c also includes a plurality of slots 127 defined thereon for accommodating a corresponding tab of each of the plurality of shims 130, as described herein. Each of the plurality of grid spacers 120 includes a grid spacer frame defining at least one aperture therethrough. Specifically, each of the plurality of grid spacers 120 include a grid spacer frame defining a perimeter. At least one orthogonal grid spacer cross-member is positioned between opposing sidewalls of the grid spacer frame. The space between the grid spacer frame and the grid spacer cross-member defines the at least one aperture above and below the corresponding MCP 110. Each of the plurality of grid spacers 120 may have any suitable thickness, for example in the range of 1 to 7 millimeters inclusive of all ranges and values therebetween. c Expanding further, each of the grid spacers (e.g., the third grid spacer 120c shown in FIG. 3B right) includes a grid spacer frame 121 defining a perimeter. The grid spacer frame 121 has a square shape but in other embodiments, the grid spacer frame 121c can be rectangular, circular, oval, elliptical, polygonal or have any other suitable shape. A grid spacer cross-member 123 is positioned orthogonally between opposing sidewalls of the grid spacer frame 121 (e.g., at an angle of about 90 degrees). A second grid spacer cross-member 125 is also positioned orthogonally between opposing sidewalls of the grid spacer frame 121 such that the second grid spacer cross-member 125 is also positioned orthogonally to the first grid spacer cross-member 123 (e.g., at an angle of about 90 degrees).

In this manner, the first grid spacer cross-member 123 and the second grid spacer cross-member 125 divides the area bounded by the grid spacer frame 121 into a grid including four apertures such that at least a portion of the corresponding MCP 110 is positioned within each aperture defined by the respective grid spacer 120. For example, as shown in FIGS. 1 and 2A, the first MCP 110a is interposed between the first grid spacer 120a and the second grid spacer 120b such that at least a portion of the opposing surfaces of the first MCP 110a is positioned between the grid spacer frames 121 of the first grid spacer 120a and the second grid spacer 120b, the first grid spacer cross-members 123/125 as well as the second grid spacer cross-members thereof.

While the grid spacer frames (e.g., the grid spacer frame 121a/b/c) only support the corresponding MCP 110 from its edges, the grid spacer cross-members 123/125 provide additional support to the MCPs 110 so that much smaller portions of the MCPs 110 positioned within the apertures are suspended and, thereby unsupported. The additional support provided by the grid spacer cross-members 123/125 can therefore provide support to much larger MCPs 110. Furthermore, the grid spacer cross-members 123/125 may also support a top plate 104 (described in detail below), the anode plate 140 so as to prevent a UHV used to seal the MCP photodetector assembly 100 from crushing the top plate 104 and/or the anode plate 140. The additional support enables significant increase in the size of the MCP photodetector assembly 100 relative to other MCP photodetector assemblies which only provide support to MCPs at their edges.

FIG. 3B right shows the third grid spacer 120c (and thereby the first grid spacer 120a and the second grid spacer 120b) including orthogonal grid spacer cross-members 123/125 positioned orthogonally to each other in a "cross" orientation. In some embodiments, the grid spacer cross-members 123/125 may be positioned in any other configuration, for example diagonally or parallel with respect to one another. Furthermore, the grid spacers 120 can include any number of cross-members positioned in any suitable configuration based on the overall size of the MCPs 110 included in the MCP photodetector assembly 100.

As described before, photons entering the MCP photodetector assembly 100 impinge on the photocathode 122 generating a cascade of photoelectrons or electrons. The photocathode 122, the anode plate 140 and/or each of the opposing surfaces of the plurality of MCPs 110 may be polarized at a high voltage so as to generate the cascade of electrons. To electrically couple electric potential received from an external high voltage source to the surfaces the MCPs 110, a plurality of shims 130 are positioned between each of the plurality of grid spacers 120 and the plurality of MCPs 110 so as to form a stack, as shown in FIG. 3A. The stack is positioned on the anode plate 140 as shown in FIGS. 2A-B.

The photocathode 122 is positioned on the stack and configured to generate photoelectrons when impinged upon by light or photons. In some embodiments, the photocathode 122 includes a thin film of a photocathode material (e.g., Ag—O—Cs, Sb—Cs, Na—K—Sb. Na—K—Sb—Cs, GaAs, InGaAs, Cs—Te, Cs—I, Cs—Te or any other suitable photocathode material) disposed (e.g., deposited, coated, sputtered, evaporated or the like) on an inner surface of the top plate 104 positioned on the stack (e.g., on the first grid spacer 120a). The top plate 104 may be formed from an optically transparent material (e.g., glass, Pyrex, quartz, etc.) A photocathode electrical contact 124 is electrically coupled to the photocathode 122 so as to apply an electric potential (hv0) thereto. The photocathode electrical contact 124 may include a thin film of a conducting material (e.g., a metal such as gold, platinum, etc.) deposited around the photocathode 122, for example along an outer edge of the photocathode 122 film so as to electrically couple to the photocathode 122 film. The electric potential may be configured to urge the photocathode 122 to generate photoelectrons on exposure to light which are accelerated towards the MCPs 110.

Each of the plurality of shims 130 has a shim shape which is the same as the grid spacer shape such that each of the plurality of shims 130 and each of the plurality of grid spacers 120 overlap so as to define a MCP aperture. At least a portion of the plurality of MCPs 110 are positioned within the MCP aperture, as described previously.

Expanding further, the first shim 130a is positioned between the first grid spacer 120a and a top surface of the first MCP 110a so as to provide a first electrical connection (hv1) to the top surface of the first MCP 110a. The second shim 130b is positioned between the second grid spacer 120b and a bottom surface of the first MCP 110a so as to provide a second electrical connection (hv2) to the bottom surface of the first MCP 110a. Similarly, the third shim 130c is positioned between the second grid spacer 120b and a top surface of the second MCP 110b so as to provide a thirds electrical connection (hv3) to the top surface of the third MCP 110c. Moreover, the fourth shim 130d is positioned between the third grid spacer 120c and a bottom surface of the second MCP 110b so as to provide a fourth electrical connection (hv4) to the bottom surface of the second MCP 110b.

Each of the plurality of shims 130 are formed from an electrically conductive material (e.g., stainless steel, aluminum, gold, platinum, copper, etc.) so as to conduct an electrical signal (e.g., a current or a voltage) to a corresponding surface of a corresponding MCP 110 in contact with a respective shim 130 of the plurality of shims 130. Furthermore, each of the plurality of shims 130 includes a tab positioned proximate to the anode plate 140 and extending beneath the stack so as to contact a corresponding electrical trace 142 of the anode plate 140, thereby electrically coupling a corresponding surface of the corresponding MCP 110 to the corresponding electrical trace 142.

Figure 3C:
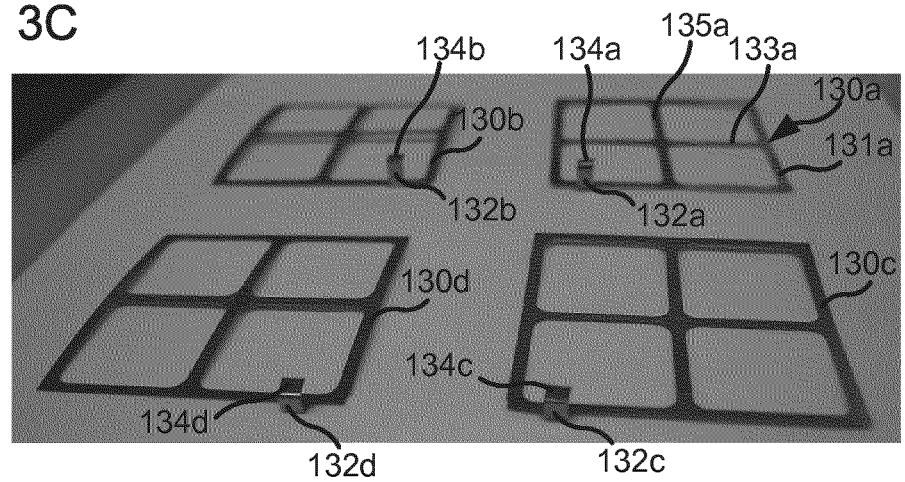
FIG. 3C is front, top, perspective view of a plurality of shims included in the MCP photodetector assembly of FIG. 1.

For example, FIG. 3C shows a front, top, perspective view of the plurality of shims 130. Each of the plurality of shims 130a/b/c/d include a shim frame 131a/b/c/d which corresponds to the shape and size of the grid spacer frames 121a/b/c. A first shim cross-member 133a/b/c/d is positioned orthogonally between opposing sidewalls of the shim frames 131a/b/c/d. A second shim cross-member 135a/b/c/d is also positioned orthogonally between opposing sidewalls of the shim frame 131a/b/c/d and orthogonal to the first shim cross member 133a/b/c/d.

The first shim cross-members 133a/b/c/d and the second shim cross-members 135a/b/c/d correspond in shape and size to the first grid spacer cross-members 123a/b/c and the second grid space cross-members 125a/b/c, respectively so that each of the plurality of shims 130 have the shim shape which is the same as the grid spacer shape of the plurality of grid spacers 120. Similar to the first grid spacer cross-members 123a/b/c and the second grid spacer cross-members 125a/b/c, the first shim cross-members 133a/b/c/d and the second shim cross-members 135a/b/c/d may also provide additional structural support so as to allow the shims 130 to have any size corresponding to the dimensions of the grid spacers 120 or otherwise the stack.

The shims 130 may have a shim thickness which is substantially smaller than the thickness of the grid spacers 120 and the MCPs 110. For example, the shims 130 can be formed from a metallic sheet having a thickness in the range of 50 microns to 1,000 microns (e.g., 50, 100, 150, 200, 300, 400, 500, 600, 700, 800, 900 or 1,000 microns). In some embodiments, the shims 130 may be secured between the corresponding grid spacers 120 and the MCP 110 via a mechanical force, for example provided by the top plate 104 and the anode plate 140 as a result of the UHV provided to the MCP photodetector assembly 100, as described in detail below. In some embodiments, the shims 130 may be adhered to the grid spacers 120 via an adhesive (e.g., silicone, glue or any other suitable adhesive). Furthermore, the shims 130 may be glued to the corresponding surface of the MCP 110 via a conductive adhesive, for example silver and/or silver chloride adhesive.

As described before, each shim 130 of the plurality of shims 130 includes a tab electrically coupling a corresponding surface of the corresponding MCP 110 to a corresponding electrical trace 142 of the anode plate 140. For example, as shown in FIGS. 1, 2A and 3C, each of the shims 130a/b/c/d include a leg 132a/b/c/d extending orthogonally (e.g., at an angle of about 90 degrees) away from a side of the shim 130a/b/c/d towards the anode plate 140. A tab 134a/b/c/d is positioned on an end of the leg proximate to the anode plate 140. The tab 134a/b/c/d extends orthogonally (e.g., at an angle of about 90 degrees) from the end of leg 132a/b/c/d beneath the stack (i.e., between the third grid spacer 120c and the anode plate 140). Each of the tabs 134a/b/c/d contact a corresponding electrical trace 142a/b/c/d (see FIG. 1 and FIGS. 2A-B) beneath the stack so as to electrically coupled a corresponding surface of the corresponding MCP 110 to the corresponding electrical trace 142.

In various embodiments, each of the shim frames 131a/b/c/d, the first shim cross-members 133a/b/c/d, the second shim cross-members 135a/b/c/d, the legs 132a/b/c/d and the tabs 134a/b/c/d may be monolithically formed (e.g., via stamping, bending, molding, or any combination thereof) so that each shim 130 is a monolithic structure. FIGS. 1, 2A-B and 3C show the legs 132a/b/c/d and the tabs 134a/b/c/d extending orthogonally away from each other. In other embodiments, the shims 130a/b/c/d may include a curved tab extending away from side the shims 130 towards the anode plate 140 so as to extend beneath the stack. As shown in FIG. 3B notches or slots 127 may be provided on a surface of the third grid spacer 120c in contact with the anode plate 140. The slots 127 may correspond to a respective tab 134a/b/c/d of the shims 130a/b/c/d so as to allow the respective tab 134a/b/c/d to protrude between the third grid spacer 120c and the anode plate 140 (i.e., below the stack) to contact a corresponding electrical trace 142 without any interference.

As described before, the photocathode 122 is deposited on an inner surface of the top plate 104 facing the stack. The top plate 104 is substantially planar and is formed from a strong, rigid and transparent material, for example glass so as to allow photons or other electromagnetic radiation to pass therethrough onto the photocathode 122 deposited on the inner surface thereof A sidewall 106 is positioned on the anode plate 140, as shown in FIG. 1 and FIG. 3B (left). The sidewall 106 defines a boundary within which the stack is positioned. In some embodiment, the sidewall 106 is formed from the same material as the anode plate 140, for example glass. The sidewall 106 is hermetically bonded to the anode plate 140. For example, the sidewall 106 is fusion bonded to the anode plate 140 with glass frit at high temperature so as to form a hermetic bond between the sidewall 106 and the anode plate 140. The electrical traces 142 of the anode plate 140 pass underneath the sidewall 106 from the boundary defined by the sidewall 106 to outside thereof so as to interface with external electronics. In this manner, the conducting surfaces of the MCPs 110 positioned within the boundary defined by the sidewall 106 may be electrically coupled to the external electronics located outside the boundary defined by the sidewall 106.

A sealing member 108 is positioned between the sidewall 106 and the top plate 104. The sealing member 108 may include a rubber gasket, a silicone gasket, an indium vacuum seal or any other suitable sealing member. The anode plate 140, the top plate 104, the sidewall 106 and the sealing member 108 define the internal volume within which the stack is positioned.

The internal volume is vacuum sealed by exposing to an UHV to draw out all the air within the internal volume and, thereby the stack. Removal of the air because of the UHV urges the top plate 104 towards the anode plate 140 so as to compress the stack, thereby securing the stack and the electrical coupling between the tab 134a/b/c/d of each of the plurality of shims 130 and the corresponding electrical trace 142 of the plurality of electrical traces 142 of the anode plate 140.

In some embodiments, the grid spacers 120 may be configured to allow crushing of the sealing member 108 (e.g., an indium vacuum seal) by the top plate 104 due to the UHV so as to enable a leak-tight seal to be formed between the sidewall 106 and the top plate 104 by the crushed sealing member 108. In other embodiments, the sealing member 108 may be melted to form the leak-tight seal. As used herein, the term "leak-tight" is understood to encompass both a hermetic seal (i.e., a seal that is gas-impervious) as well as a seal that is liquid-impervious.

In this manner, the shims 130 are electrically coupled to the tab 134 as well as the stack is secured by only the mechanical pressure applied by the top plate 104 and the anode plate 140 compressing the stack without using any adhesives, clamps or any other securing mechanism. Furthermore, the internal volume is maintained at UHV while the electrical traces 142 of traces of the anode plate 140 extend beneath the sidewall 106 to the outside environment for electrical coupling to external electronics. In some embodiments, getter strips may be inserted between the sidewall 106 and the stack during assembly of the MCP photodetector assembly 100. The getter strips may be used to actively pump residue gas from the internal volume even after the UHV process is complete.

FIG. 4 is a schematic flow diagram of an example method 200 for forming an MCP photodetector assembly, for example the MCP photodetector assembly 100. The method 200 includes positioning a sidewall on an anode plate at 202. For example, the sidewall 106 is positioned on the anode plate 140. The sidewall is bonded to the anode plate at 204. For example, the sidewall 106 is bonded to the anode plate 140, for example using glass frit, as described herein.

A plurality of MCPs are provided at 206. For example, the first MCP 110a and the second MCP 110b are provided. Each of the plurality of MCPs is positioned between a corresponding shim of a plurality of shims at 208. Each shim includes a shim frame in contact with a corresponding surface of the MCP. A leg extends orthogonally away from a side of the shim frame. A tab is positioned on an end of the leg distal from the shim frame and extends orthogonally away from the leg towards shim frame. For example, the first MCP 110a is positioned between the first shim 130a and the second shim 130b. Furthermore, the second MCP 110b is positioned between the third shim 130c and fourth shim 130d.

A grid spacer is positioned in contact with each shim of the plurality of shims so as to interpose a corresponding MCP therebetween, thereby forming a stack at 210. For example, the first grid spacer 120a is positioned in contact with the first shim 130a and the second grid spacer 120b is positioned in contact with the second shim 130b thereby interposing the first MCP 110a therebetween. Furthermore, the second grid spacer 120b is also positioned in contact with the third shim 130c and the third grid spacer 120c is positioned in contact with the fourth shim 130d thereby interposing the second MCP 110b therebetween. The combination of the MCPs 110, the grid spacers 120 and the shims 130 form the stack.

The stack is positioned on the anode plate at 212. The anode plate includes a plurality of electrical traces positioned thereon such that a tab of each shim of the plurality of shims contacts a corresponding electrical trace of the plurality of electrical traces positioned on the anode plate so as to form an electrical coupling therebetween. For example, the stack is positioned on the anode plate 140 which includes the plurality of electrical traces 142. The tabs 134 of each of the plurality of shims 130 extend beneath the stack so as to contact a corresponding electrical trace 142 of the anode plate 140 and form an electrical coupling therebetween.

A sealing member is positioned on the sidewall at 214. For example, the sealing member 108 (e.g., an indium vacuum seal) is positioned on the sidewall 106. A top plate is positioned on a respective grid spacer of the plurality of grid spacers positioned on top of the stack opposite the anode plate at 210. The top plate includes a thin film of a photocathode material disposed on an inner surface thereof. At least a portion of the top plate may also be in contact with the sealing member. For example, the top plate 104 is positioned on the first grid space 120a. The top plate includes a film of the photocathode 122 disposed thereon, and is positioned on the first grid spacer 120a which is positioned opposite the anode plate 140.

An internal volume defined by the anode plate, the sidewall, the sealing member and the top plate is vacuum sealed at 216. For example, the internal volume defined by the anode plate 140, the sidewall 106, the sealing member 108 and the top plate 104, with the stack positioned therein is exposed to an UHV. The UHV draws out air from the internal volume thereby compressing the top plate 104 towards the anode plate 140. As the top plate 104 is drawn towards the anode plate 140, the top plate may crush the sealing member 108 (e.g., an indium vacuum seal) positioned between the top plate 104 and the sidewall 106 so as to form the vacuum seal. In some embodiments, the sealing member 108 may be melted to form the vacuum seal. Furthermore, the UHV urges the top plate 104 towards the anode plate 140, thereby compressing the stack and securing the components of the stack as well as the electrical coupling between the tabs 134 and the corresponding electrical traces of the anode plate 140.

It should be noted that the term "exemplary" as used herein to describe various embodiments is intended to indicate that such embodiments are possible examples, representations, and/or illustrations of possible embodiments (and such term is not intended to connote that such embodiments are necessarily extraordinary or superlative examples).

The terms "coupled," and the like as used herein mean the joining of two members directly or indirectly to one another. Such joining may be stationary (e.g., permanent) or moveable (e.g., removable or releasable). Such joining may be achieved with the two members or the two members and any additional intermediate members being integrally formed as a single unitary body with one another or with the two members or the two members and any additional intermediate members being attached to one another.

It is important to note that the construction and arrangement of the various exemplary embodiments are illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter described herein. Other substitutions, modifications, changes and omissions may also be made in the design, operating conditions and arrangement of the various exemplary embodiments without departing from the scope of the present invention.

While this specification contains many specific implementation details, these should not be construed as limitations on the scope of any inventions or of what may be claimed, but rather as descriptions of features specific to particular implementations of particular inventions. Certain features described in this specification in the context of separate implementations can also be implemented in combination in a single implementation. Conversely, various features described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Thus, particular implementations of the invention have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. A microchannel plate (MCP) photodetector assembly, comprising:
   an anode plate including a plurality of electrical traces positioned thereon;
   a plurality of microchannel plates (MCPs);
   a plurality of grid spacers, the plurality of MCPs positioned between the plurality of grid spacers, each of the plurality of grid spacers having a grid spacer shape defining at least one aperture; and
   a plurality of shims positioned between each of the plurality of grid spacers and the plurality of MCPs so as to form a stack, the stack positioned on the anode plate, each of the plurality of shims having a shim shape, the shim shape and the grid spacer shape being the same such that each of the plurality of shims and each of the plurality of grid spacers overlap so as to define at least one MCP aperture,
   wherein at least a portion of the plurality of MCPs is positioned within the MCP aperture, and wherein each shim of the plurality of shims includes an electrically conductive material so as to conduct an electric signal to a corresponding surface of a corresponding MCP in contact with a respective shim, each shim further including a tab positioned proximate to the anode plate, the tab extending beneath the stack so as to contact a corresponding electrical trace of the plurality of electrical traces, thereby electrically coupling the corresponding surface of the corresponding MCP to the corresponding electrical trace.

2. The MCP photodetector assembly of claim 1, wherein each shim further comprises a leg extending orthogonally away from a side of the shim towards the anode plate, and wherein the tab is positioned on an end of the leg located proximate to the anode plate.

3. The MCP photodetector assembly of claim 1, further comprising:
a photocathode positioned on the stack opposite the anode plate.

4. The MCP photodetector assembly of claim 3, further comprising:
a sidewall positioned on the anode plate, the sidewall defining a boundary within which the stack is positioned;
a top plate formed from a transparent material, the top plate positioned on the stack; and
a sealing member positioned between the sidewall and the top plate,
wherein the anode plate, the sidewall, the top plate and the sealing member define an internal volume within which the stack is positioned.

5. The MCP photodetector assembly of claim 4, wherein the photocathode comprises a thin film of a photocathode material disposed on an inner surface of the top plate.

6. The MCP photodetector assembly of claim 4, wherein the internal volume is vacuum sealed, the vacuum sealing configured to urge the top plate towards the anode plate so as to compress the stack, thereby securing the stack, and the electrical coupling between the tab of each of the plurality of shims and the corresponding electrical trace of the plurality of electrical traces of the anode plate.

7. The MCP photodetector assembly of claim 1, wherein at least a portion of the electrical traces of the anode plate are electrically coupled to an electrical ground.

8. The MCP photodetector assembly of claim 1, wherein each of the plurality of grid spacers include a grid spacer frame defining a perimeter, and wherein at least one orthogonal grid spacer cross member is positioned between opposing sidewalls of the grid spacer frame.

9. The MCP photodetector assembly of claim 8, wherein each of the plurality of shims include a shim frame corresponding to the grid spacer frame, and wherein each shim includes at least one orthogonal shim cross-member positioned between opposing sidewalls of the shim frame, the at least one shim cross-member corresponding to the at least one grid spacer cross-member.

10. The MCP photodetector assembly of claim 1, wherein each of the plurality of grid spacers is formed from a transparent material.

11. A microchannel plate (MCP) photodetector packaging assembly for stacking and electrically coupling a plurality of microchannel plates (MCPs), comprising;
an anode plate including a plurality of electrical traces positioned thereon;
a plurality of grid spacers, each of the plurality of MCPs positionable between a pair of the plurality of grid spacers so as to be interposed therebetween; and
a plurality of shims positionable between each of the plurality of grid spacers and the plurality of MCPs so as to form a stack, the stack positionable on the anode plate,
wherein each of the plurality of shims includes an electrically conductive material so as to conduct an electric signal to a corresponding surface of a corresponding MCP in contact with a respective shim of the plurality of shims, each shim further including a leg extending orthogonally away from a side of the shim towards the anode plate, a tab positioned on an end of the leg located proximate to the anode plate, the tab extending orthogonally from the leg so as to be positionable beneath the stack, the tab structured to contact a corresponding electrical trace of the plurality of electrical traces so as to electrically couple the corresponding surface of the corresponding MCP to the corresponding electrical trace.

12. The MCP photodetector packaging assembly of claim 11, further comprising;
a photocathode positionable on the stack opposite the anode plate.

13. The MCP photodetector packaging assembly of claim 12, further comprising:
a sidewall positioned on the anode plate, the sidewall defining a boundary within which the stack is positionable;
a top plate formed from a transparent material, the top plate positionable on the stack; and
a sealing member positionable between the spacer and the top plate,
wherein the anode plate, the sidewall, the top plate and the sealing member define the internal volume within which the stack is positionable.

14. The MCP photodetector packaging assembly of claim 13, wherein the internal volume is configured to be vacuum sealed, the vacuum sealing configured to urge the top plate towards the anode plate so as to compress the stack, thereby securing the stack, and the electrical coupling between the tab of each of the plurality of shims and the corresponding electrical trace of the plurality of electrical traces of the anode plate.

15. The MCP photodetector packaging assembly of claim 13, wherein the photocathode comprises a thin film of a photocathode material disposed on an inner surface of the top plate.

16. The MCP photodetector packaging assembly of claim 11, wherein each of the plurality of grid spacers includes a grid spacer frame defining a perimeter, and wherein at least one orthogonal grid spacer cross member is positioned between opposing sidewalls of the grid spacer frame.

17. The MCP photodetector packaging assembly of claim 16, wherein each of the plurality of shims includes a shim frame corresponding to the grid spacer frame, and wherein each shim includes at least one orthogonal shim cross-member positioned between opposing sidewalls of the shim frame, the at least one shim cross-member corresponding to the at least one grid spacer cross-member.

* * * * *